United States Patent [19]

Hataishi et al.

[11] E Patent Number: Re. 31,652

[45] Reissued Date of Patent: Aug. 28, 1984

[54] METHOD OF PRODUCING A SEMICONDUCTOR DEVICE

[75] Inventors: Osamu Hataishi, Yokohama; Yoshinobu Momma, Kitakami; Ryoji Abe, Sagamihara, all of Japan

[73] Assignee: Fujitsu Limited, Kawasaki, Japan

[21] Appl. No.: 527,498

[22] Filed: Aug. 29, 1983

Related U.S. Patent Documents

Reissue of:

[64] Patent No.: 4,343,080
Issued: Aug. 10, 1982
Appl. No.: 155,122
Filed: May 30, 1980

[30] Foreign Application Priority Data

May 31, 1979 [JP] Japan ..... 54/67611

[51] Int. Cl.[3] ..... H01L 21/22

[52] U.S. Cl. ..... 29/571; 29/576 W; 29/578; 148/187

[58] Field of Search ..... 29/571, 576 W, 578; 148/175, 187

[56] References Cited

U.S. PATENT DOCUMENTS

| | | | |
|---|---|---|---|
| 3,783,047 | 1/1974 | Paffen et al. | 148/187 |
| 3,911,471 | 10/1975 | Kooi et al. | 148/175 |
| 3,920,483 | 11/1975 | Johnson et al. | 148/1.5 |

*Primary Examiner*—G. Ozaki
*Attorney, Agent, or Firm*—Staas & Halsey

[57] ABSTRACT

In a case where a semiconductor device is produced comprising at least one semiconductor element, an isolation region surrounding the semiconductor element and a thick silicon oxide layer lying on and around the semiconductor element, the thick oxide layer is formed by thermally-oxidizing the epitaxial layer having a buried layer and, at the same time, the isolation region is formed in the epitaxial layer by heating for thermal oxidation. Prior to a step of introducing impurities into the epitaxial layer, a patterned thin silicon oxide layer is formed. This thin silicon oxide layer is varied into the thick oxide layer by the thermal-oxidation treatment.

8 Claims, 23 Drawing Figures

PRIOR

METHOD OF PRODUCING A SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method for producing a semiconductor device comprising at least one semiconductor element and an isolation region which are formed in an epitaxial layer formed on a semiconductor substrate. More particularly, the present invention relates to a method for forming both a silicon oxide layer which lies on and around the semiconductor element, and an isolation region which lies around the semiconductor element and has an opposite conductivity type to that of the epitaxial layer.

2. Description of the Prior Art

In a case where a semiconductor integrated circuit is produced by forming semiconductor elements, such as transistors, and passive elements, such as diffused resistors, in an epitaxial layer formed on a silicon semiconductor substrate, generally, after a silicon oxide layer is formed as a protecting layer on the surface of the integrated circuit, connecting lines of a conductor, such as aluminum, are formed on the silicon oxide layer. In this case, in order to decrease the parasitic capacity between the epitaxial layer and the aluminum connecting lines, the above-mentioned silicon oxide layer is made thick. Furthermore, in order to prevent a so-called parasitic effect from occuring between the semiconductor elements, an isolation region between the semiconductor elements is formed by introducing impurities having an opposite conductivity type to that of the epitaxial layer into a predetermined portion of the epitaxial layer.

A semiconductor element (e.g. an npn-type bipolar transistor) of an integrated circuit is illustrated in the schematic sectional view of FIG. 1. Such a bipolar transistor is illustrated in FIG. 2 of U.S. Pat. No. 3,911,471. In FIG. 1, reference numerals 1, 2, 2' and 3 indicate a p-type silicon substrate, an n-type silicon epitaxial layer, an isolated region and an n-type buried layer, respectively. The electrical resistance of the epitaxial layer 2 is high and, consequently, the breakdown voltage between the collector and the base of the bipolar transistor is high. The buried layer 3 can reduce the series resistance of the collector. Reference numerals 4, 5, 6 and 7 indicate a p-type base region, an n-type emitter region, an n-type collector connecting region and an isolation region, respectively. These regions 4, 5, 6 and 7 are formed in the epitaxial layer 2. Since the isolation region 7 has the opposite conductivity type to that of the epitaxial layer and surrounds the isolated region 2', it is possible to electrically isolate the bipolar transistor from other transistors and passive elements (not shown). Reference numerals 8, 8A through 8C, 9, 10 and 11 indicate a silicon oxide layer, thick portions of the silicon oxide layer, a collector electrode, a base electrode and an emitter electrode, respectively. The thick portions 8A, 8B and 8C of the silicon oxide layer 8 decrease the parasitic capacitance between the epitaxial layer and the connecting lines of the electrodes 9, 10 and 11. According to FIG. 1 the thick portions of the silicon oxide layer are separated, but the thick portions may be combined in a manner not shown in FIG. 1.

The bipolar transistor illustrated in FIG. 1 is produced in the following manner. Referring to FIG. 2, the starting material is a p-type silicon semiconductor substrate 1. N-type impurities are introduced into a predetermined portion of the silicon substrate 1 by ion-implantation or thermal diffusion to form a buried layer 3. An n-type silicon epitaxial layer 2 is formed on the silicon substrate 1 by epitaxial growth and, at the same time, some impurities diffuse out of the buried layer 3 into the epitaxial layer 2, so that the buried layer 3 expands up to a broken line in FIG. 2. A silicon nitride layer serving as an anti-oxidation masking layer is formed on the epitaxial layer 2 by chemical vapor deposition and, then, is selectively removed by photoetching, so that portions 12A, 12B and 12C of the silicon nitride layer remain, as illustrated in FIG. 2. If desired, a thin oxide layer may be provided under the silicon nitride layer.

Next, the semiconductor body comprising the silicon substrate 1 and the silicon epitaxial layer 2 is thermally oxidized at 1000° C. for approximately 2 hours. Since the silicon nitride layer portions 12A, 12B and 12C serve as an anti-oxidation mask during the oxidation period, a silicon dioxide ($SiO_2$) layer 13 having a thickness of approximately 700 nm is formed, as illustrated in FIG. 3.

The formed silicon dioxide layer 13 is removed by etching to expose a portion of the epitaxial layer 2. Then, the semiconductor body is also thermally oxidized at 1000° C. for approximately 8 hours to form a thick silicon dioxide layer 14 having a thickness of approximately 1.4 $\mu$m, as illustrated in FIG. 4.

Next, a photoresist layer (not shown) is applied on the entire surface and, then, a portion of the resist layer which lies on the silicon nitride layer portion 12A is removed. P-type impurities are introduced through the silicon nitride layer portion 12A into the epitaxial layer 2 by ion-implantation to form a high concentration region 15 of p-type impurities, as illustrated in FIG. 5. After the applied resist layer is removed, another photoresist layer is applied onto the entire surface, and then, a portion of the resist layer which lies on the silicon nitride layer portion 12B is removed. N-type impurities are introduced through the silicon nitride layer portion 12B into a portion of the epitaxial layer 2 by ion-implantation to form a high concentration region 16 of n-type impurities, as illustrated in FIG. 5.

The obtained semiconductor body is heated at 1100° C. for approximately 1 hour, whereby the p-type impurities in the high concentration regions 15 diffuse into the epitaxial layer 2 and arrive at the silicon substrate 1 to form an isolation region 7 for isolating semiconductor elements from each other and, at the same time, the n-type impurities in the high concentration region 16 diffuse and arrive at the buried layer 3 to form a collector connecting region 6, as illustrated in FIG. 6.

Next, the remaining silicon nitride layer portions 12A, 12B and 12C are removed to expose portions of the epitaxial layer 2. The obtained semiconductor body is thermally oxidized at 900° C. for approximately 30 minutes to form a thin silicon dioxide layer 8, having a thickness of approximately 50 nm, on the surfaces of the exposed portions of the epitaxial layer including the isolation region 7 and the collector connecting region 6, as illustrated in FIG. 7. A patterned photo resist layer 17 is formed on the thin and thick silicon dioxide layers 8 and 14, as illustrated in FIG. 7. P-type impurities are introduced through a portion of the thin silicon dioxide layer 8 into a portion of the isolated region 2' of the epitaxial layer 2 by ion-implantation to form a high concentration region 18 of the p-type impurities.

The obtained semiconductor body is annealed by heating at 1000° C. for approximately 10 minutes, whereby the impurities in the high concentration region 18 diffuse to a predetermined depth in the epitaxial layer 2, so that a base region 5 is formed, as illustrated in FIG. 8. Then, N-type impurities are introduced into a portion of the base region 5 by ion-implantation subsequent to etching of a portion of the thin silicon dioxide layer lying on the base region 5 by photoetching. An annealing treatment is carried out at 1000° C. for approximately 20 minutes to form an emitter region 4, as illustrated in FIG. 1.

Openings for the collector electrode 9 and for the base electrode 11 are formed in the thin silicon dioxide layer above the collector connecting region 6 and the base region 5, respectively, by photoetching, as illustrated in FIG. 1. Finally, a conductor layer of aluminum is formed on the entire surface by vapor deposition and, then, is selectively removed by photoetching to form the collector, base and emitter electrodes 9, 11 and 10, respectively. In the above described manner, an npn-type bipolar transistor isolated from other elements is produced, as illustrated in FIG. 1.

However, when the thick silicon dioxide layer 14 (FIG. 4) is formed prior to the introduction of impurities into the epitaxial layer 2, a portion of the epitaxial layer lying under the silicon nitride layer portions 12A, 12B and 12C is oxidized into silicon dioxide. Namely, a portion of the thick silicon dioxide layer 14 enters under the silicon nitride layer portions to form a so-called bird's beak, as illustrated in FIG. 4. Since the bird's beak of silicon dioxide prevents the impurities from entering into the epitaxial layer 2, for example, in order to form the isolation region 7 having a width of 1 μm, it is necessary to make the width of the silicon nitride layer portion 12A approximately 3 μm. As the width of the silicon nitride layer portion 12A increases, on the one hand, its area increases, and on the other hand, the area for semiconductor elements and passive elements of the integrated circuit decreases. Therefore, it is difficult to increase the degree of integration of the semiconductor elements and the passive elements in the integrated circuit.

Furthermore, according to the above-mentioned production method, the method comprises the step of forming the thick silicon dioxide layer, and the step of diffusing the impurities for forming the isolation region and the collector connecting region, namely, a heat-treatment is carried out at least two times. When the heat-treatment is repeated, the impurities in the buried layer diffuse upward in the epitaxial layer. As the result of this, the breakdown voltage between the collector and the emitter decreases.

SUMMARY OF THE INVENTION

It is an object of the present invention to increase the degree of integration of semiconductor elements and passive elements in an integrated circuit over that of the prior art and to prevent the breakdown voltage between the collector and the base of a bipolar transistor from decreasing, by providing an improved method for producing a semiconductor device comprising at least one semiconductor element and an isolation region which are formed in an epitaxial layer formed on a semiconductor substrate.

The present invention is based on recognition of the fact that (1), in a case where impurities are introduced into the epitaxial layer prior to the step of forming a thick oxide layer by thermal oxidation, an integrated circuit design (i.e. the shapes and dimensions of the semiconductor elements, the passive elements and the isolation region) can be determined without having to take into consideration a bird's beak of the thick oxide layer, and that (2) a formation step of the thick oxide layer and a formation step of the isolation region can be carried out in one heat treatment.

According to the present invention, a method of producing a semiconductor device comprising at least one semiconductor element and an isolation region, which are formed in an epitaxial layer formed on a semiconductor substrate having a buried layer, comprises the steps of:

forming an anti-oxidation masking layer on the epitaxial layer;

selectively removing the masking layer by photoetching to expose portions of the epitaxial layer;

thermally oxidizing the exposed portions of the epitaxial layer to form a thin oxide layer;

forming a patterned resist layer;

introducing impurities into a predetermined portion of the epitaxial layer which is covered by the masking layer and is not under the resist layer;

removing the patterned resist layer; and thermally oxidizing the epitaxial layer by using the remaining anti-oxidation masking layer as a mask to form a thick oxide layer, at the same time the introduced impurities are diffused into the epitaxial layer to form the isolation region.

DESCRIPTION OF THE PREFERRED EMBODIMENTS

The present invention will now be explained in detail by the following embodiments A through D with reference to the drawings.

Embodiment A

Figure 9:
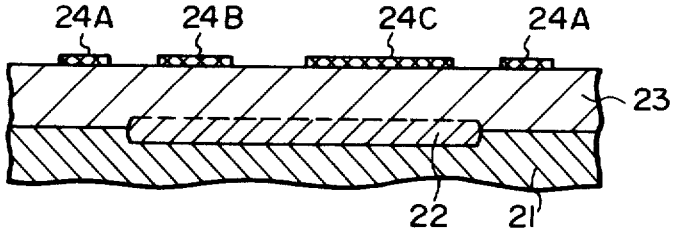
FIGS. 9 through 13 are schematic sectional views of a bipolar transistor in intermediate stages of production in accordance with an embodiment A of the present invention.

Referring to FIG. 9, the starting material is a p-type silicon semiconductor substrate 21. N-type impurities (e.g. antimony) are introduced into a predetermined portion of the silicon substrate 21 to form an $n^+$-type buried layer 22. An n-type silicon epitaxial layer 23, having a high resistance, is formed on the silicon substrate 21 and, at the same time, some n-type impurities diffuse out of the buried layer 22 into the epitaxial layer 23, so that the buried layer 22 expands up to a broken line in FIG. 9. A silicon nitride layer having a thickness of approximately 50 nm and serving as an anti-oxidation masking layer is formed on the epitaxial layer 23 by chemical vapor deposition, and then, is selectively removed by photoetching so that portions 24A, 24B and 24C of the silicon nitride layer remain, as illustrated in FIG. 9.

Figure 10:
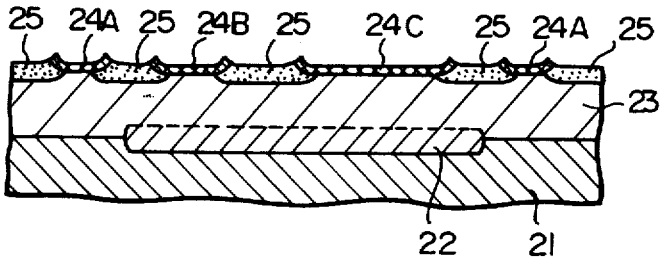

Next, the semiconductor body comprising the silicon substrate 21 and the epitaxial layer 23 is heated at 1000° C., for approximately 2 hours, in an oxidizing atmosphere. As the result, the portion of the epitaxial layer 23 which is not covered by the silicon nitride layer portions 24A, 24B and 24C is oxidized to form a thin silicon dioxide layer 25 having a thickness of approximately 700 nm, as illustrated in FIG. 10.

Figure 11:
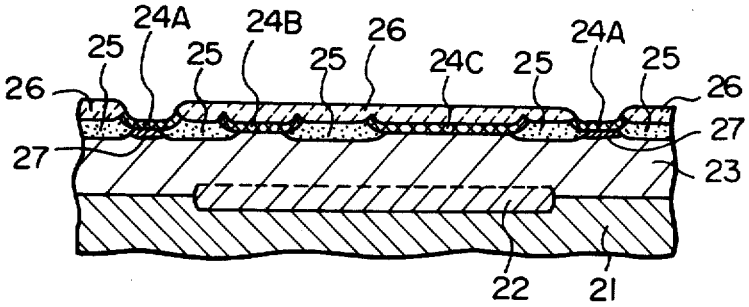

A photo resist layer 26 is applied on the entire surfaces of the silicon nitride layer portions 24A, 24B and 24C, and the thin silicon dioxide layer 25, and then, is selectively etched to remove a portion of it which lies on the silicon nitride layer portion 24A, as illustrated in FIG. 11. P-type impurities (e.g. boron) are introduced through the silicon nitride layer portion 24A into the epitaxial layer 23 by ion-implantation to form a high concentration region 27 (FIG. 11) of p-type impurities.

Figure 12:
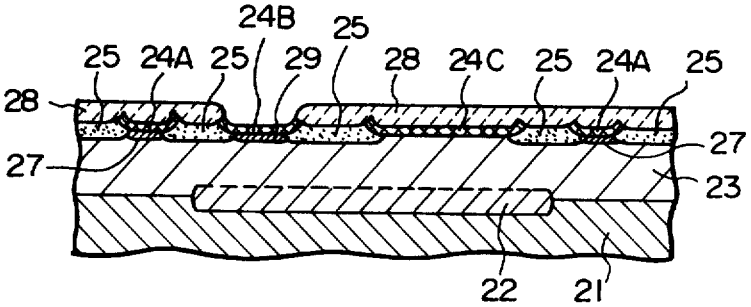

After the photo resist layer 26 is removed, another photo resist layer 28 is applied onto the entire surfaces of the layer portions 24A, 24B and 24C, and the layer 25, and then, is selectively etched to remove a portion of it which lies on the silicon nitride layer portion 24B, as illustrated in FIG. 12. N-type impurities (e.g. phosphorus) are introduced through the silicon nitride layer 24B into the epitaxial layer 23 by ion-implantation to form a high concentration region 29 (FIG. 12) of n-type impurities. The photo resist layer 28 is then removed.

Figure 13:
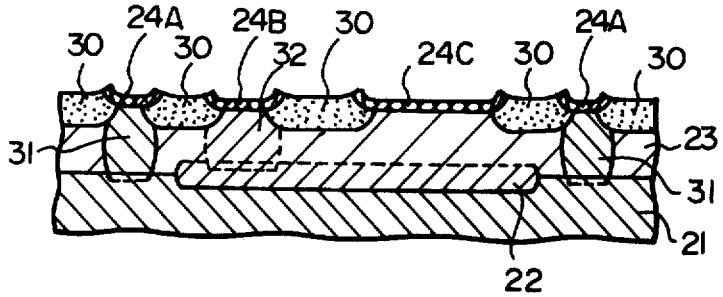

Next, the obtained semiconductor body is heated at 1000° C., for approximately 6 hours, in the oxidizing atmosphere. As a result of the heat-treatment, i.e. a thermal oxidation treatment, the thickness of the thin silicon dioxide layer 25 increases to form a thick silicon dioxide layer 30 having a thickness of approximately 1.4 μm, the p-type impurities in the high concentration region 27 diffuse into the epitaxial layer 23 and arrive at the silicon substrate 21 to form an isolation region 31 and, simultaneously, the n-type impurities in the high concentration region 29 diffuse and arrive at the buried layer 22 to form a collector connecting region 32, as illustrated in FIG. 13.

Thus, since the formation of the thick silicon dioxide layer, the isolation region and the collector connecting region are simultaneously carried out, the number of heat-treatments is decreased as compared with the above-mentioned prior art method of producing a semiconductor device. Therefore, the decrease in the breakdown voltage between the collector and the base caused by diffusing the n-type impurities out of the buried layer into the epitaxial layer is smaller than in the prior art.

In order to complete a bipolar transistor, a base region, an emitter region, a collector electrode, a base electrode, an emitter electrode and a required thin silicon dioxide layer are formed in the same manner as in the above-mentioned prior art method.

Embodiment B

Figure 14:
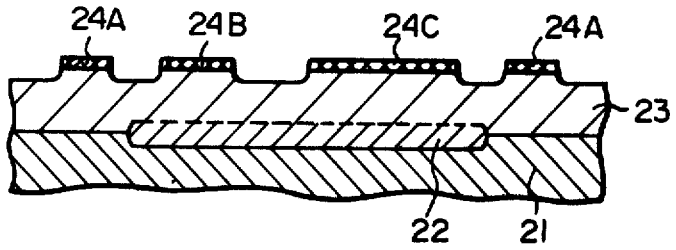
FIGS. 14 and 15 are schematic sectional views of a bipolar transistor in intermediate stages of production in accordance with an embodiment B of the present invention.
Figure 15:
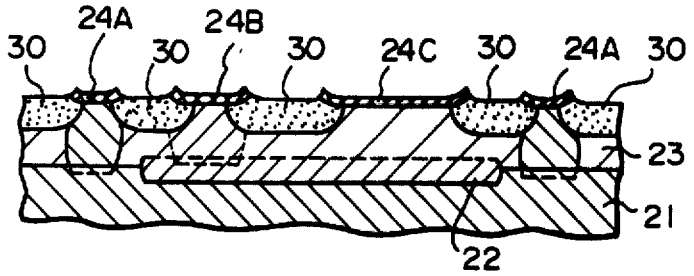

Prior to the step of forming the thin silicon dioxide layer 25 (FIG. 10) of the embodiment A of the present invention, a portion of the epitaxial layer 23 can be etched by an etchant (e.g., $HF:HNO_3AgNO_3=5:40:1$), as illustrated in FIG. 14. In this case, the silicon nitride layer portions 24A, 24B and 24C serve as a mask, and the etching depth is approximately 300 nm. Furthermore, the etching of the epitaxial layer can be carried out by a plasma etching process. In this case, a photoresist layer (not shown) is applied onto the silicon nitride layer subsequent to formation of the silicon nitride layer and, then, is exposed and developed. Since all of the silicon nitride layer, except for its portions 24A, 24B and 24C, is exposed, the exposed portion of the silicon nitride layer and the portion of the epitaxial layer thereunder can be etched by plasma. Then, the obtained semiconductor body is treated in the same manner as in method of the embodiment A to obtain the semiconductor body in the state illustrated in FIG. 15.

The difference between the levels of the surface of the thick silicon dioxide layer 30 (FIG. 15) and the surface of the epitaxial layer 23 (FIG. 15) is smaller as compared with that of the semiconductor body in the state illustrated in FIG. 13, in the case of the embodiment A.

Embodiment C

Figure 16:
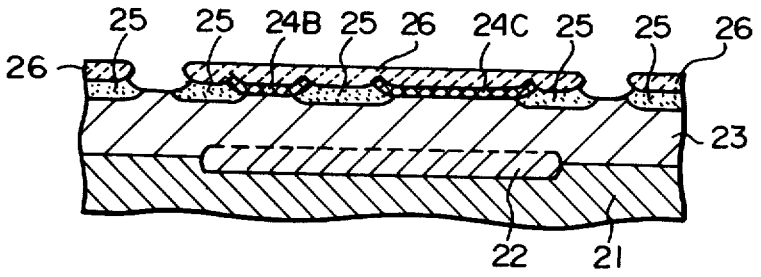
FIGS. 16 and 17 are schematic sectional views of a bipolar transistor in intermediate stages of production in accordance with the embodiment C of the present invention.
Figure 17:
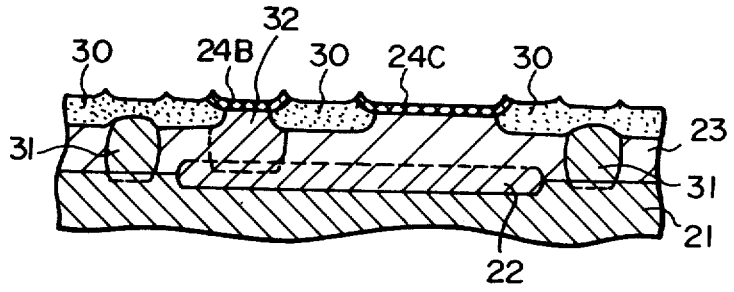

Subsequent to the step of forming the photoresist layer 26 (FIG. 11) and prior to the step of introducing the impurities of the embodiment A, the silicon nitride layer portion 24A can be etched as illustrated in FIG. 16. Therefore, the p-type impurities can be directly introduced into an exposed portion of the epitaxial layer 23. The procedure for producing a semiconductor device in this embodiment, except for the above-mentioned etching step is same as that of the embodiment A. As the result, the semiconductor body in the state illustrated in FIG. 17 is obtained. A portion of the thick silicon dioxide layer 29 is formed on the isolation region 31, whereby the parasitic capacitance between a connecting line and the isolation region can be decreased.

Embodiment D

Figure 18:
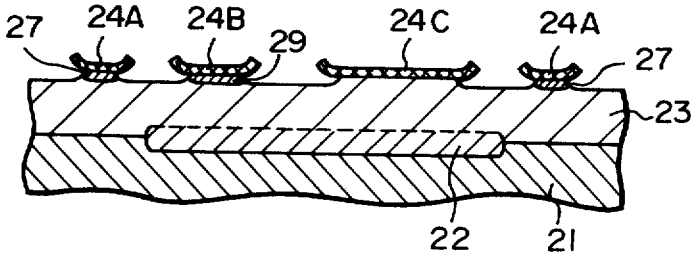
FIGS. 18 and 19 are schematic sectional views of a bipolar transistor in intermediate stages of production in accordance with an embodiment D of the present invention.
Figure 19:
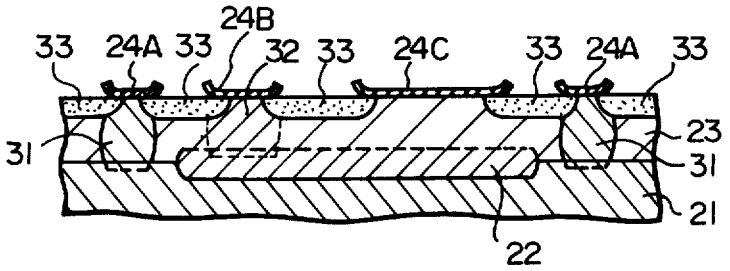

Subsequent to the step of removing the photo resist 28 (FIG. 12) of the embodiment A, the thin silicon dioxide layer 25 (FIG. 12) can be etched by an aqueous solution of hydrofluoric acid, as illustrated in FIG. 18. Then, the obtained semiconductor body is heated under the same conditions as those of the heating step of the embodiment A, so that an exposed portion of the epitaxial layer 23 is oxidized to form a thick silicon dioxide layer 33 having a thickness of approximately 1.4 μm, as illustrated in FIG. 19. At the same time, the isolation region 31 and the collector connecting region 32 are formed. Since the surfaces of the epitaxial layer 23 and the thick silicon dioxide layer 33 are almost flat, it is possible to produce a planar type bipolar transistor.

Figure 20:
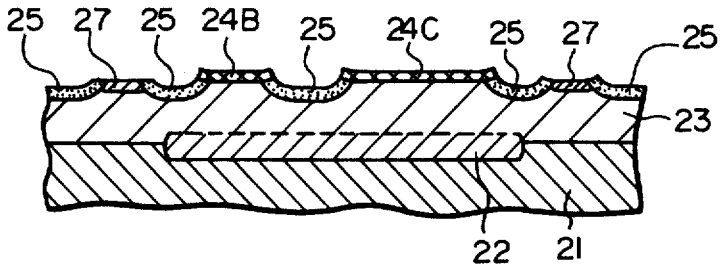
FIGS. 20 through 22 are schematic sectional views of a bipolar transistor in intermediate stages of production in accordance with combinations of the other embodiments.
Figure 21:
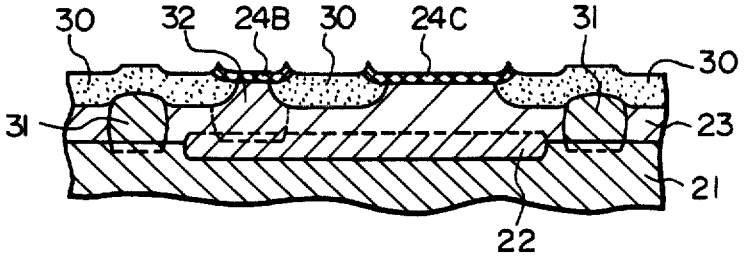
Figure 22:
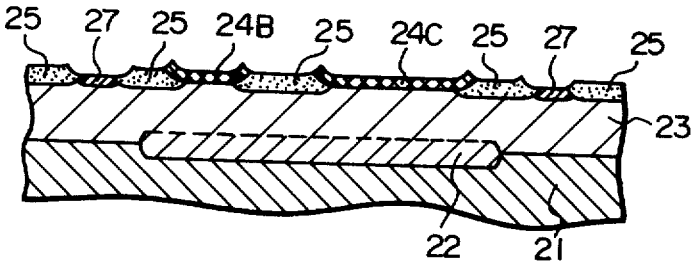
Figure 23:
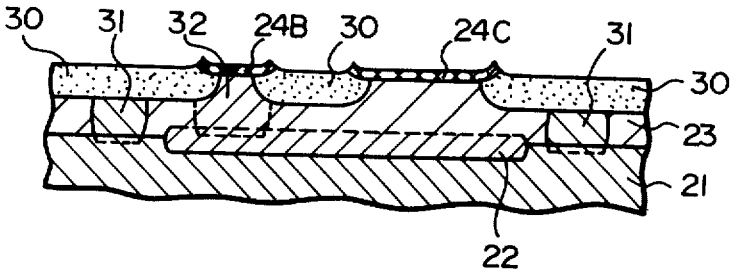
FIG. 23 is a schematic sectional view of a bipolar transistor in an intermediate stage of production in accordance with a variant combination of the embodiments.

Furthermore, it is possible to combine the above-mentioned embodiments B, C and D. For example, a combination of the embodiments B and C and a combination of the embodiments C and D can be carried out. In a case where the embodiments B and C are combined, subsequent to the step of forming the high concentration region 27 and prior to the step of forming the photo resist layer 28 of the embodiment A, the semiconductor body in the state illustrated in FIG. 20 is obtained. As a result, after the thermal oxidation for the thick silicon dioxide layer 30 is carried out, the semiconductor body in the state illustrated in FIG. 21 is obtained. In a case where the embodiments C and D are combined, the semiconductor body in the state illustrated in FIG. 21 is also obtained via the state illustrated in FIG. 22. The above-mentioned combinations of the embodiments can further include the step of etching a portion of the epitaxial layer corresponding to the isolation region subsequent to the step of etching the silicon nitride layer portion of the embodiment C. As a result, the semiconductor body in the state illustrated in FIG. 23 is obtained.

In the embodiment A, a photo etching technique (i.e. photo lithography) is used, but an electron beam lithography, an ion beam lithography or an X-ray lithography may be used.

Figure 1:
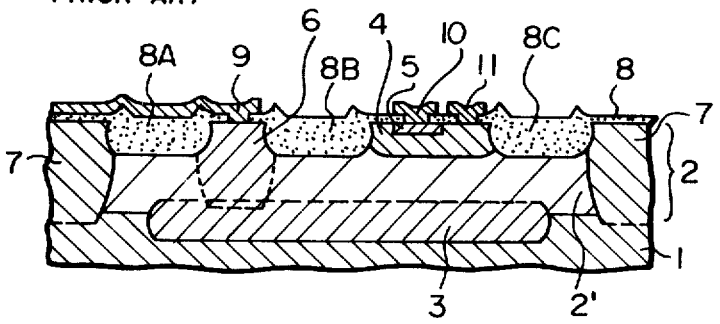
Fig. 1 PRIOR ART
FIG. 1 is a schematic sectional view of a prior art bipolar transistor of an integrated circuit.
Figure 2:
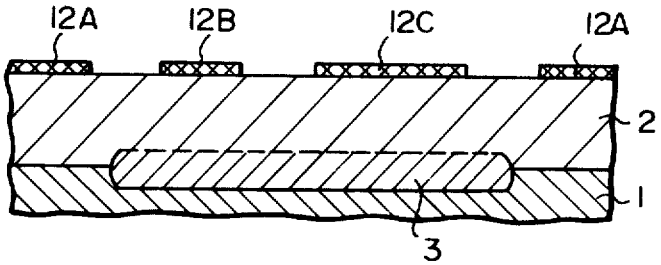
Fig. 2 PRIOR ART
FIGS. 2 through 8 are schematic sectional views of the bipolar transistor of FIG. 1 in intermediate stages of production in accordance with prior art techniques.
Figure 3:
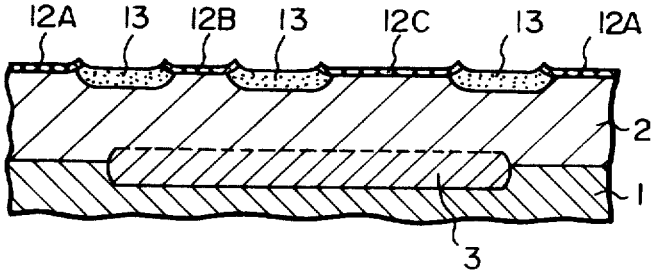
Fig. 3 PRIOR ART
Figure 4:
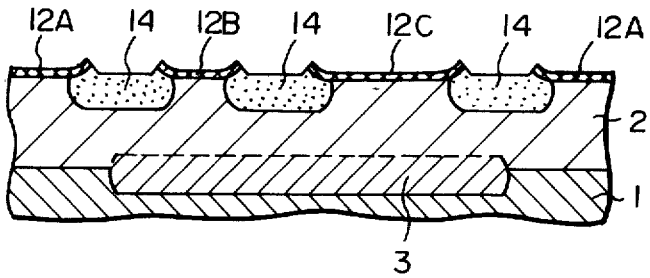
Figure 5:
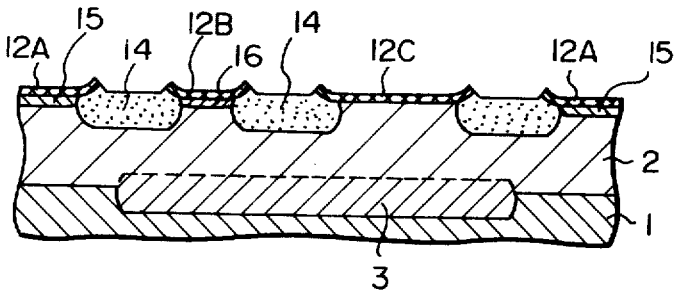
Fig. 5 PRIOR ART
Figure 6:
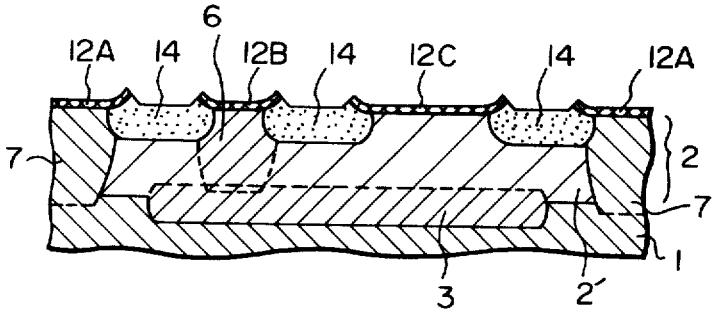
Fig. 6 PRIOR ART
Figure 7:
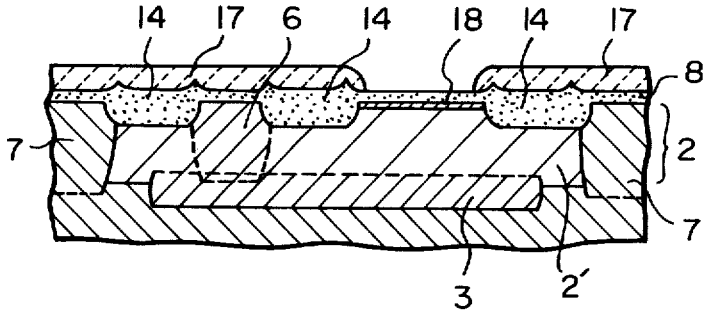
Fig. 7 PRIOR ART
Figure 8:
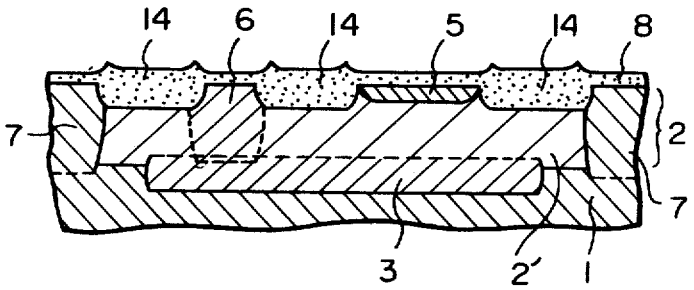
Fig. 8 PRIOR ART

Furthermore, in a case where the length of the thick silicon dioxide portion 8C (FIG. 1), namely, the distance between the isolation region 7 and the base region 4 (FIG. 1) is 2 μm and below, the punch through phenomenon after occurs, when a depletion layer extending from the base region-exitaxial layer interface into the isolated region 2' (FIG. 1) is joined to a depletion layer extending from the isolation region-epitaxial layer interface into the isolated region 2'. The punch through phenomenon generates an undesirable leakage current. In order to prevent the punch through phenomenon from occurring, it is preferable to introduce n-type impurities (a dose of $5\times10^{12}$ atoms/cm$^2$ at an energy of 60 KeV) into a portion of the epitaxial layer 2 lying under the silicon dioxide layer portion 8C by ion-implantation prior to the step of forming the thick silicon dioxide layer portion 8C.

It will be obvious that the present invention is not restricted to the above-mentioned embodiments, and that many variations are possible for those skilled in the art without departing from the scope of the present invention. For example, it is possible to produce a pnp-type bipolar transistor instead of the npn-type bipolar transistor. An anti-oxidation masking layer may be made of silicon carbide instead of silicon nitride.

We claim:

1. A method of producing a semiconductor device comprising at least one bipolar transistor and an isolation region which are formed in an epitaxial layer formed on a semiconductor substrate having a buried layer, said method comprising, in sequence, the steps of:

forming an anti-oxidation masking layer on said epitaxial layer, selectively removing said masking layer by etching to expose portions of said epitaxial layer, thermally oxidizing said exposed portions of the epitaxial layer to form a thin oxide layer, introducing a first impurity into a first predetermined portion of said epitaxial layer corresponding to said isolation region by using a first patterned resist layer as a mask, introducing a second impurity through said masking layer into a second predetermined portion of said epitaxial layer corresponding to a collector-connecting-region of the bipolar transistor by using a second patterned resist layer as a mask, thermally oxidizing said epitaxial layer by using the remaining anti-oxidation masking layer as to mask to form a thick oxide layer, while at the same time diffusing said introduced first and second impurities into said epitaxial layer to form said isolation region and said collector-connecting-region coming into contact with said buried layer, respectively, and forming a base region and an emitter region of the bipolar transistor in a portion of said epitaxial layer above said buried layer.

2. The method of claim 1, wherein said substrate has the conductivity type of said first impurity type.

3. The method of claim 1 or 2, comprising the step of etching said exposed portions of the epitaxial layer prior to the formation of the thin oxide layer.

4. The method of claim 1 or 2, wherein said first impurity for said isolation region is introduced through a selected remaining portion of said masking layer.

5. The method of claim 1 or 2, wherein said first impurity for said isolation region is directly introduced into the respective portion of said epitaxial layer, after a portion of said masking layer on said respective portion of the epitaxial layer is removed by etching by using said first resist layer as a mask.

6. The method of claim 1 or 2, comprising the step of removing said thin oxide layer prior to said forming of the thick oxide layer and subsequent to said introducing of said second impurity.

*7. A method of producing a semiconductor device comprising at least one semiconductor element and an isolation region, which are formed in an epitaxial layer formed on a semiconductor substrate having a buried layer, comprising the steps of;*

*forming an anti-oxidation masking layer on the epitaxial layer;*

*selectively removing the masking layer by etching to uncover portions of the epitaxial layer;*

*thermal-oxidizing the exposed portions of the epitaxial layer to form a thin oxide layer;*

*forming a patterned resist layer to selectively cover said masking layer;*

*introducing impurities into a predetermined portion of the epitaxial layer which is not under the resist layer;*

*removing the patterned resist layer; and*

*thermal-oxidizing the epitaxial layer by using the remaining anti-oxidation masking layer as a mask to form a thick oxide layer, at the same item the introduced impurities are diffused into the epitaxial layer to form the isolation region.*

* * * * *

UNITED STATES PATENT AND TRADEMARK OFFICE

CERTIFICATE OF CORRECTION

PATENT NO. : Re 31,652

DATED : 28 Aug. 1984

INVENTOR(S) : Osamu Hataishi et al

It is certified that error appears in the above-identified patent and that said Letters Patent is hereby corrected as shown below:

Column 8, line 15, "to" should be --a--.

Insert new reissue claim 8.

8. The method of claim 7, comprising the step of selectively removing, prior to said thermal-oxidizing step to form said thick oxide layer, a portion of said masking layer to expose a part of the epitaxial layer at which said isolation region is to be formed, whereby said thick oxide layer is formed also on said part of the epitaxial layer during said thermal-oxidizing step to form said thick oxide layer.

Signed and Sealed this

*Nineteenth* Day of *March 1985*

[SEAL]

*Attest:*

DONALD J. QUIGG

*Attesting Officer* *Acting Commissioner of Patents and Trademarks*